(12) United States Patent
Mangrum

(10) Patent No.: US 7,196,427 B2
(45) Date of Patent: Mar. 27, 2007

(54) STRUCTURE HAVING AN INTEGRATED CIRCUIT ON ANOTHER INTEGRATED CIRCUIT WITH AN INTERVENING BENT ADHESIVE ELEMENT

(75) Inventor: Marc A. Mangrum, Manchaca, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 17 days.

(21) Appl. No.: 11/108,223

(22) Filed: Apr. 18, 2005

(65) Prior Publication Data

US 2006/0231938 A1    Oct. 19, 2006

(51) Int. Cl.
*H01L 23/498* (2006.01)
*H01L 23/48* (2006.01)
*H01L 25/065* (2006.01)

(52) U.S. Cl. .............................. 257/778; 257/E23.067; 257/E25.013; 257/E25.006; 257/E25.27; 257/686; 257/685; 257/777; 257/723; 257/780; 257/737; 257/738; 257/690; 257/692; 257/693; 257/675

(58) Field of Classification Search ........ 257/E23.067, 257/E25.013, E25.006, E25.027, 777–780, 257/734, 737, 738, 698, 690–693, 686, 685, 257/723, 675
See application file for complete search history.

(56) References Cited

U.S. PATENT DOCUMENTS

| | | |
|---|---|---|
| 4,110,642 A | 8/1978 | Thiele |
| 4,283,903 A | 8/1981 | Mayhall et al. |
| 4,355,496 A | 10/1982 | Teates et al. |
| 4,522,888 A | 6/1985 | Eichelberger et al. |
| 4,670,347 A | 6/1987 | Lasik et al. |
| 4,699,830 A | 10/1987 | White |
| 4,770,921 A | 9/1988 | Wacker et al. |
| 4,813,495 A | 3/1989 | Leach |
| 5,014,849 A | 5/1991 | Becker |
| 5,041,319 A | 8/1991 | Becker et al. |
| 5,090,563 A | 2/1992 | Becker |
| 5,102,712 A | 4/1992 | Pierce et al. |
| 5,104,282 A | 4/1992 | Gleason |
| 5,247,423 A | 9/1993 | Lin et al. |
| 5,346,861 A | 9/1994 | Khandros et al. |
| 5,367,764 A | 11/1994 | DiStefano et al. |
| 5,477,611 A | 12/1995 | Sweis et al. |
| 5,744,405 A | 4/1998 | Okumura et al. |
| 5,744,827 A | 4/1998 | Jeong et al. |
| 5,754,405 A | 5/1998 | Derouiche |
| 5,814,297 A | 9/1998 | Dean et al. |
| 5,845,545 A | 12/1998 | Braun et al. |

(Continued)

*Primary Examiner*—Alexander Oscar Williams
(74) *Attorney, Agent, or Firm*—Robert L. King

(57) ABSTRACT

Two or more semiconductor packages are stacked with an intervening element that is positioned between within an area surrounded by conductive bumps of a bottom surface of the overlying package. Different shapes of the intervening element are used depending upon how many sides of the bottom surface have conductive bumps. In one form the intervening element extends laterally from the stack and is bent downward to contact or extend through an underlying substrate. Contact to the intervening element at the backside of the substrate may be made. In another form the intervening element is bent upward for enhancing thermal properties. The intervening element is adhesive to prevent non-destructive removal of the packages thereby adding increased security for information contained within the packages. Selective electrical shielding between packages is also provided.

20 Claims, 5 Drawing Sheets

U.S. PATENT DOCUMENTS

| | | | |
|---|---|---|---|
| 5,848,467 A | 12/1998 | Khandros et al. |
| 5,861,666 A | 1/1999 | Bellaar |
| 5,885,849 A | 3/1999 | DiStefano et al. |
| 5,910,682 A | 6/1999 | Song |
| 5,915,170 A | 6/1999 | Raab et al. |
| 5,939,779 A | 8/1999 | Kim |
| 5,943,558 A | 8/1999 | Kim et al. |
| 5,950,304 A | 9/1999 | Khandros et al. |
| 5,975,402 A | 11/1999 | Kim |
| 6,045,289 A | 4/2000 | Tseng |
| 6,051,887 A | 4/2000 | Hubbard |
| 6,075,284 A | 6/2000 | Choi et al. |
| 6,087,722 A | 7/2000 | Lee et al. |
| 6,092,713 A | 7/2000 | Kim |
| 6,121,676 A | 9/2000 | Solberg |
| 6,137,162 A | 10/2000 | Park et al. |
| 6,169,328 B1 | 1/2001 | Mitchell et al. |
| 6,222,259 B1 | 4/2001 | Park et al. |
| 6,225,688 B1 | 5/2001 | Kim et al. |
| 6,252,301 B1 | 6/2001 | Gilleo et al. |
| 6,313,528 B1 | 11/2001 | Solberg |
| 6,316,825 B1 | 11/2001 | Park et al. |
| 6,345,485 B1 | 2/2002 | Boone et al. |
| 6,372,527 B1 | 4/2002 | Khandros et al. |
| 6,380,615 B1 | 4/2002 | Park et al. |
| 6,380,629 B1 | 4/2002 | Kim |
| 6,392,306 B1 | 5/2002 | Khandros et al. |
| 6,453,453 B1 | 9/2002 | Soukas et al. |
| 6,462,408 B1 | 10/2002 | Wehrly, Jr. |
| 6,492,251 B1 | 12/2002 | Haba et al. |
| 6,518,662 B1 | 2/2003 | Smith et al. |
| 6,521,480 B1 | 2/2003 | Mitchell et al. |
| 6,526,429 B1 | 2/2003 | Lai et al. |
| 6,559,526 B2 | 5/2003 | Lee et al. |
| 6,563,223 B2 | 5/2003 | Freeman |
| 6,572,781 B2 | 6/2003 | Haba |
| 6,576,992 B1 | 6/2003 | Cady et al. |
| 6,589,813 B1 | 7/2003 | Park |
| 6,608,763 B1 | 8/2003 | Buros et al. |
| 6,617,675 B2 | 9/2003 | Sakai et al. |
| 6,620,474 B1 | 9/2003 | Regnier et al. |
| 6,651,321 B2 | 11/2003 | Beroz et al. |
| 6,677,181 B2 | 1/2004 | Park et al. |
| 6,678,952 B2 | 1/2004 | Jamil |
| 6,709,895 B1 | 3/2004 | Distefano |
| 6,723,584 B2 | 4/2004 | Kovac et al. |
| 6,724,074 B2 | 4/2004 | Song et al. |
| 6,750,539 B2 | 6/2004 | Haba et al. |
| 6,762,078 B2 | 7/2004 | Shin et al. |
| 6,806,120 B2 | 10/2004 | Wehrly, Jr. |
| 6,820,330 B1 | 11/2004 | Haba |
| 6,821,815 B2 | 11/2004 | Smith et al. |
| 6,825,552 B2 | 11/2004 | Light et al. |
| 6,828,686 B2 | 12/2004 | Park |
| 6,849,802 B2 | 2/2005 | Song et al. |
| 6,982,488 B2 | 1/2006 | Shin et al. |
| 7,098,073 B1 * | 8/2006 | Mangrum | 438/107 |
| 2001/0012643 A1 | 8/2001 | Asada |
| 2004/0245651 A1 | 12/2004 | Nishisako et al. |
| 2005/0006745 A1 | 1/2005 | Nishimura |

* cited by examiner

US 7,196,427 B2

STRUCTURE HAVING AN INTEGRATED CIRCUIT ON ANOTHER INTEGRATED CIRCUIT WITH AN INTERVENING BENT ADHESIVE ELEMENT

CROSS REFERENCE TO RELATED APPLICATION

This application is related to U.S. patent application Ser. No. 11,108,224, now U.S. Pat. No. 7,098,073 entitled "Method For Stacking An Integrated Circuit On Another Integrated Circuit" filed of even date by the inventor named herein and assigned to the assignee hereof.

FIELD OF THE INVENTION

This disclosure relates to semiconductors, and more particularly to semiconductor packaging by stacking integrated circuits on each other.

RELATED ART

Various semiconductor package structures have been proposed and used to house semiconductor die. Many of these structures have elements for providing noise isolation and thermal dissipation. As the need and desire for more compact semiconductor devices continues, some integrated circuits have been stacked directly on top of each other. Various issues are associated with the stacking of integrated circuit packages. Such issues include the increased concentration of heat that is not effectively dissipated, the alignment of packages and package leads, and the associated electrical interference which is inherent both within the footprint of the packages and along the outgoing leads of the packages.

For example, when semiconductor packages are stacked the thermal effects combine linearly. As a result, others have proposed stacking packages with air gaps between the packages sufficient to obtain thermal convection. However, the use of air gaps provides limited thermal enhancement for many modern semiconductors which dissipate multiple watts of power. Utilization of thermally enhanced materials in direct contact with a semiconductor package improves the power dissipation qualities of the semiconductor package.

Past approaches to compensate for noise have been directed toward shielding an entire completed semiconductor assembly around an entire perimeter of the semiconductor assembly. Insulated wire may also be used for packages having wire bonds.

Additionally, when FLASH memory is included within a stacked package, security of the data stored in the FLASH memory is problematic. When the critical data and control pins of a FLASH memory can be physically accessed such as by removal of the FLASH memory package from a stacked assembly, its contents can be easily obtained by extraction. Yet further problems often encountered with various known stacked semiconductor package technologies are the effects of warpage of the package substrate during a high temperature reflow to join the semiconductor packages together. For example, under certain conditions the substrate surface of a lower package may become concave while the substrate surface of an upper package may become convex. This warpage prevents effective and reliable solder joint formation resulting in failed electrical contact and operation. Therefore, there exist various problems associated with the stacking of two or more semiconductor packages.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally there is herein provided a method and apparatus for providing an improved method and structure for stacking semiconductor packages, as opposed to semiconductor die, having enhanced thermal and noise properties, alignment properties, and security features. Various forms of the stacked semiconductor packages may be implemented, of which several will be discussed in detail below.

Figure 1:
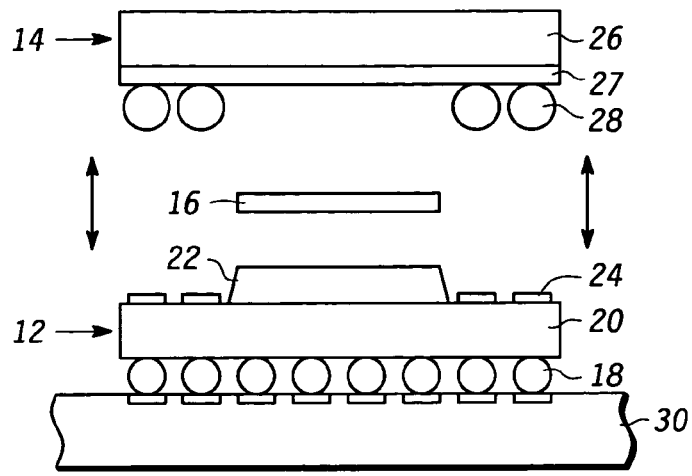
FIG. 1 illustrates in cross-sectional form the components of a stacked semiconductor package arrangement in accordance with one form of the present invention.

Illustrated in FIG. 1 is a stacked semiconductor package 10 having a first semiconductor package 12 and an overlying second semiconductor package 14. Positioned between the first semiconductor package 12 and the second semiconductor package 14 is an intervening element in the form of a thin film material 16. The thin film material 16 has adhesive properties on both sides (i.e. an upper surface and a lower surface) and in one form the adhesion is thermally activated. As a film, the thin film material 16 may be preformed to a desired precise shape having relatively precise dimensions. It should be understood that other types of adhesives however may be used. The thin film material 16 is flexible and compliant (i.e. surface conformal) and may be used with any thickness or dimension as defined by the semiconductor packages. The first semiconductor package 12 has a plurality of conductive balls for making electrical contact to a semiconductor die (not illustrated) within the first semiconductor package 12. For example, conductive ball 18 is one of a plurality of such conductive balls. As defined and used herein, a conductive ball is made of any conductive material or materials. It should be understood that the conductive balls are placed onto an underlying substrate or a motherboard 30 having a plurality of conductive contacts. The first semiconductor package 12 also has a substrate 20. The substrate 20 may be made of various materials such as a conductive film (i.e. a substrate), FR4, a Bismaleimide/Triazine (BT) laminate or other organic materials commonly used for semiconductor package substrates. Overlying the substrate 20 is a mold cap 22, the size of which is determined by the semiconductor package body size and adjacent solder lands, such as solder land 24. As used herein the term "solder land" includes any type of electrical contact. Further, the term "solder" includes various conductive materials such as conductive paste, polymer bumps, etc. in addition to a conventional solder composition. The mold cap 22 is typically a plastic molded material. When molding is completed, the substrate 20 and mold cap 22 are integral to each other. The second semiconductor package 14 also has a plurality of conductive balls, such as conductive ball 28. The conductive balls are in contact with a package substrate 27. Overlying the semiconductor package substrate 27 is a mold cap 26 which becomes integral with the package substrate 27 when molding is completed. The mold cap 26 is formed of any of a plurality of conventional mold compound materials. It should be well understood that although only two semiconductor packages are illustrated, any number of semiconductor packages may be stacked in this arrangement. Therefore, it should be understood that only a last or uppermost semiconductor package may have a mold cap that extends completely from edge to edge of the underlying package substrate. Structures other than a mold cap may used. For example, a glob top, a preformed ceramic hollow structure, a preformed metal hollow structure, glass, etc. may be used in lieu of the illustrated mold cap. Also, the last or uppermost semiconductor package may be implemented with a structure that does not extend from edge to edge of the underlying package substrate.

Figure 2:
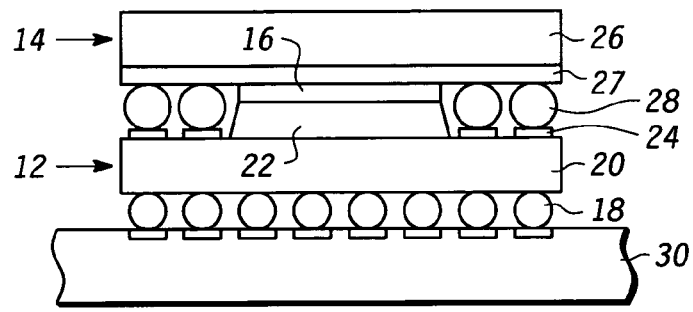
FIG. 2 illustrates in cross-sectional form a packaged assembly of the components of FIG. 1.

Illustrated in FIG. 2 is a completed assembly of the two semiconductor packages of FIG. 1. For convenience of explanation, the reference numbers will therefore be the same in both of these figures. In the method of assembly, the first semiconductor package 12 is placed on the motherboard 30 in the desired predetermined position. The conductive balls of the first semiconductor package 12 are placed in direct contact with predetermined exposed contacts of the motherboard 30. The motherboard 30 has electrical wiring (not shown) extending from each of the surface contacts to additional elements (not shown). The thin film material 16 is then placed on top of the mold cap 22 of the first semiconductor package 12. Typically the thin film material 16 is sufficiently tacky to remain in place while the second semiconductor package 14 is placed on top of the first semiconductor package 12. The placement is typically automated and performed with robotic equipment. In one form, after all components specified for a predetermined solder reflow cycle are placed or populated on the motherboard, the entire semiconductor stacked package assembly then passes through a reflow cycle in a reflow oven (not shown). During the reflow cycle in which heat is applied, the two packages will attach to themselves and with the other components to the motherboard 30 and the thin film material 16 will secure the two semiconductor stacked packages one to another. In the illustrated form, the thin film material 16 serves to minimize the warpage induced by the thermal effects of the reflow cycle and serves to secure the first semiconductor package 12 to the second semiconductor package 14, thereby preventing ease of separation. It should be noted that the thin film material 16 is compliant and conformal to the exposed surfaces of both semiconductor packages. In some configurations the bottom surface of the top or second semiconductor package 14 may be bare silicon. The surface of the mold cap 22 of the bottom or first semiconductor package 12 may be any of numerous materials, including moldable plastics. Therefore the properties of the thin film material 16 will effectively adhere to the two semiconductor packages and thereby improve the rigidity of the final stacked package assembly. This increased rigidity is important for contact joint reliability considerations and improvement of drop test performance.

In one form the second semiconductor package 14 may be implemented as a data storage or memory integrated circuit that is storing secure data that is desired to be protected from unauthorized retrieval. For example, FLASH memory is commonly used to store information. With the adhesive characteristics of the thin film material 16, if a user tries to separate the first semiconductor package 12 from the second semiconductor package 14, the second semiconductor package 14 will be damaged so that the inputs to the memory integrated circuit cannot be accessed and secure data accessed and extracted. Therefore, in addition to providing rigidity to the stacked package assembly, the thin film material 16 functions to provide security for sensitive data by making access to the data difficult.

Additionally, the thin film material 16 provides electrical shielding between the first semiconductor package 12 and the second semiconductor package 14 when using RFI and EMI materials. Therefore, protection from interfering signals from an adjacent package is obtained for that portion of the circuitry that is separated from an adjacent noise source by the thin film material 16. The insertion and integration of thin shielding material between two stacked packages enables noise abatement for high speed logic integrated circuits located in a bottom or lower package position. The noise abatement feature improves the overall performance of a packaged assembly and enables this package to be used in many noise sensitive applications such as those found in hand held and wireless products.

Figure 3:
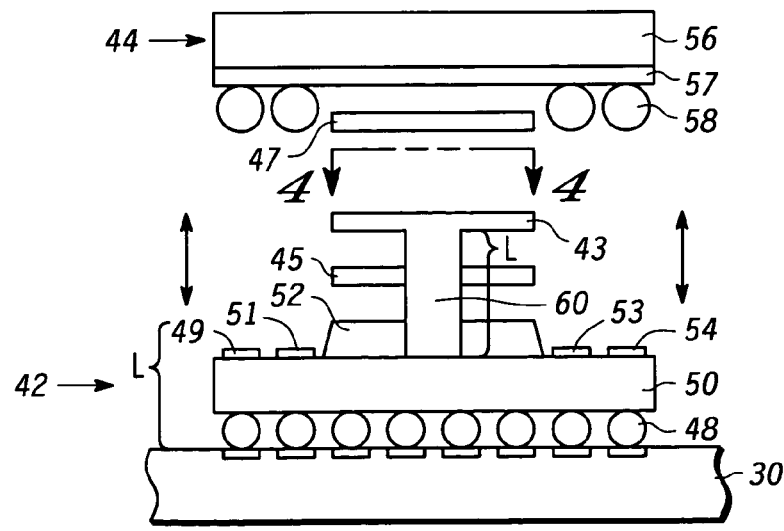
FIG. 3 illustrates in cross-sectional form the components of a stacked semiconductor package arrangement in accordance with another form of the present invention.

Illustrated in FIG. 3 is a stacked semiconductor package assembly 40 in accordance with another form of the present invention. A motherboard 30 having conductive contacts underlies a first semiconductor package 42 which underlies a second semiconductor package 44. The first semiconductor package 42 has a plurality of conductive balls for making electrical contact to a semiconductor die (not illustrated) within the first semiconductor package 42. For example, conductive ball 48 is one of a plurality of such conductive balls. As above, conductive balls are made of any conductive material. The conductive balls are placed onto the contacts of the motherboard 30. The first semiconductor package 42 also has a substrate 50. The substrate 50 may be made of various materials such as a conductive film (i.e. a substrate) FR4, a Bismaleimide/Triazine (BT) laminate or other organic materials commonly used for semiconductor package substrates. Overlying the substrate 50 is a mold cap 52, the size of which is determined by the semiconductor package body size and adjacent solder lands, such as solder lands 49, 51, 53 and 54. The mold cap 52 is typically a plastic molded material. When molding is completed, the substrate 50 and mold cap 52 are integral to each other. The second semiconductor package 44 also has a plurality of conductive balls, such as conductive ball 58. The conductive balls are in contact with a package substrate 57. Overlying the package substrate 57 is a mold cap 56 which becomes integral with the package substrate 57 when molding is completed. It should be well understood that although only two semiconductor packages are illustrated, any number of semiconductor packages may be stacked in this arrangement. Also, it should be understood that the last or uppermost semiconductor package may have a mold cap that extends completely from edge to edge of the underlying package substrate or may have a similar or modified form as the upper surface of the underlying package or packages.

Between the first semiconductor package 42 and the second semiconductor package 44 are insertable elements such as thin film materials 45 and 47 and a material 43 for the purposes of noise abatement and/or thermal enhancement. The material 43 in FIG. 3 has an extension on one or more sides which is substantially perpendicular to the illustrated lateral portion. The extension is illustrated as having a length L. The length L may vary depending upon application. As illustrated in the FIG. 3 embodiment, L is shown to be at least long enough to extend from the lateral portion of material 43 to the upper surface of the motherboard 30 when the assembly is formed. In other forms, the length may be implemented only long enough to extend lateral from the stacked package assembly and provide a contact point for one or more purposes or long enough to extend all the way through a via in the motherboard 30. It should be understood from the view illustrated in FIG. 3 that the material 43 extends outward from the stacked semiconductor package assembly 40 to make contact with either the motherboard 30 when bent downward or configured to make contact with other structures.

The thin film materials 45 and 47 may be considered optional in cases where warpage or security are not a consideration. When used, the benefits of the thin film material are similar to those stated previously in connection with thin film material 16. In the illustrated form thin film material 45 is aligned to the mold cap 52 of the first semiconductor package 42 and thin film material 47 is aligned to the bottom surface of the second semiconductor package 44. The thin film materials 45 and 47 may be of different material compositions and may be of different dimensions.

The material 43 is placed between the two semiconductor packages 42 and 44 and the thin film materials 45 and 47, when used, for the purposes of enhancing thermal properties of the stacked package assembly, and/or providing RFI and EMI shielding and/or security. When used with the thin film materials 45 and 47, the security properties of this stacked semiconductor package assembly 40 are greatly enhanced. The material 43 is selected from a readily available range of materials having singularly or in combination thermal conductive and noise shielding properties. Introduction of material 43 into this stack-up assembly improves security by impeding access to the bottom package while deterring the separation of the two packages by conventional means. When the thin film materials 45 and 47 are in place, the security of this package stack is greatly enhanced. The thin film interface between dissimilar materials of the bottom package to the material 43 and the top package and the material 43 is such that separation is destructive.

In particular, when the material 43 is attached to the motherboard 30 either through a surface interconnect or a through-hold fashion, the mechanical and thermal dissimilarities between the material sets make the structure integral as one. When trying to separate the two packages, thin film material 45 has formed a cohesive bond to the mold cap 52 and material 43. Thin material 47 has formed a cohesive bond between material 43 and package substrate 57. When attempting to separate the two packages, thermal and mechanical stresses will prevent separation of the stacked package assembly structure. In noted cases the separation is destructive to the entire stacked package assembly. Therefore, the removal of data from one of the integrated circuit packages, particularly when the integrated circuit is a memory containing secure data, is significantly impaired.

Figure 5:
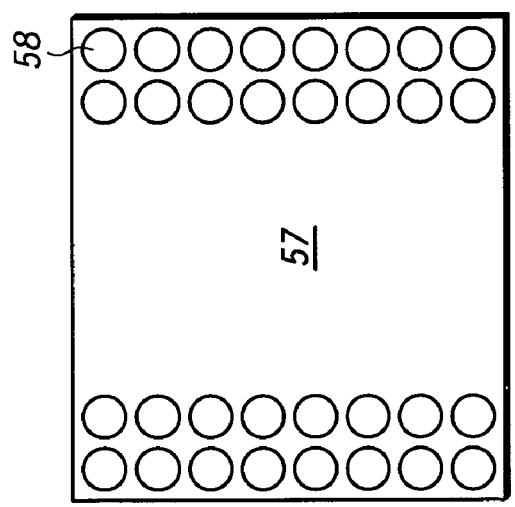
FIG. 5 illustrates a bottom view of a substrate with conductive bumps on only two sides of the top semiconductor package of FIG. 3.
Figure 4:
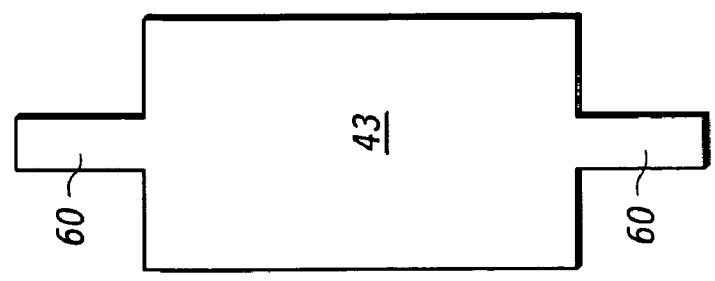
FIG. 4 illustrates a top view of one form of an element inserted between the semiconductor packages of FIG. 3.

Illustrated in FIG. 4 is a top view of one physical configuration of material 43 taken along line 4—4 of FIG. 3. This configuration enables the use of material 43 as described above. Shown are extensions 60 of length L on two sides used for attaching material 43 to the motherboard 30. Only two extensions are illustrated in consideration of the second semiconductor package 44 which as illustrated in FIG. 5 has only two sides of its bottom surface of package substrate 57 populated with conductive balls, such as a conductive ball 58.

Figure 6:
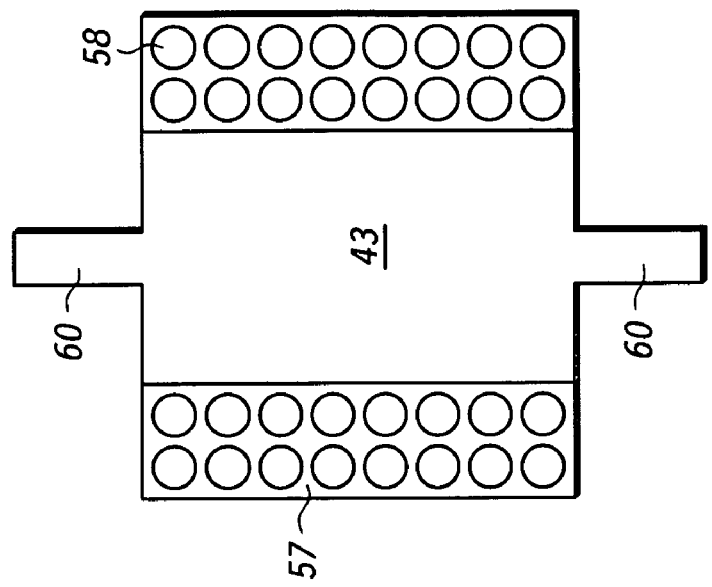
FIG. 6 illustrates in perspective form an overlay of the element of FIG. 4 with the bottom of the top semiconductor package as illustrated in FIG. 5.

Illustrated in FIG. 6 is an overlay of material 43 of FIG. 4 and the bottom surface of package substrate 57 of semiconductor package 44. In the illustrated form, the extensions are placed to extend from the two sides of the bottom surface of package substrate 57 that are not populated with conductive balls. It should be understood that the length L of the extensions 60 may vary. It should also be understood that the extensions 60 may remain lateral from the semiconductor package 44 or may be configured upward away from the motherboard 30 or downward toward, on or through the motherboard 30.

Figure 7:
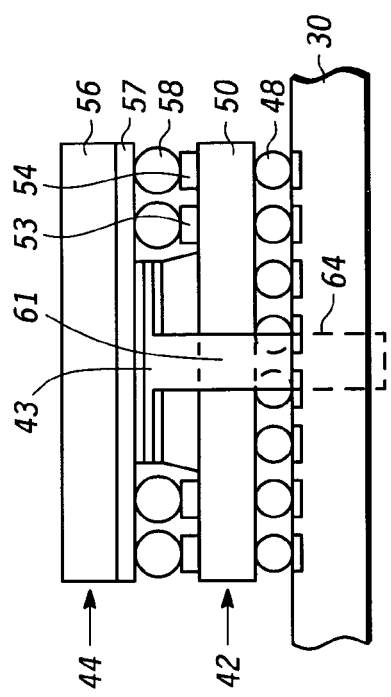
FIG. 7 illustrates in cross-sectional form a packaged assembly of the components of FIG. 3 in accordance with yet another form of the present invention.

Illustrated in FIG. 7 is a side view of a completed stacked semiconductor package assembly 40 of the two semiconductor packages of FIG. 3 with material 43 and thin film materials 45 and 47 inserted between the first semiconductor package 42 and the second semiconductor package 44. The material 43 functions as an intervening element and extends laterally away from the semiconductor package 42 from above the mold cap 52 to physically contact the underlying substrate that is motherboard 30. Various extension options exist. For example, in one form the extension 61 contacts the top surface of the motherboard 30. Electrical contact to the extension 61 may be made in various ways. For example, the extension 61 may contact an element (not shown) that is positioned on the top surface of the motherboard 30 and adjacent or integral to the completed stacked semiconductor package assembly 40. In another form the extension of extension 61 as depicted by portion 64 protrudes to or through the back side of the motherboard 30. As a result, electrical contact to the extension 61 may be made from the back of the motherboard 30.

Figure 9:
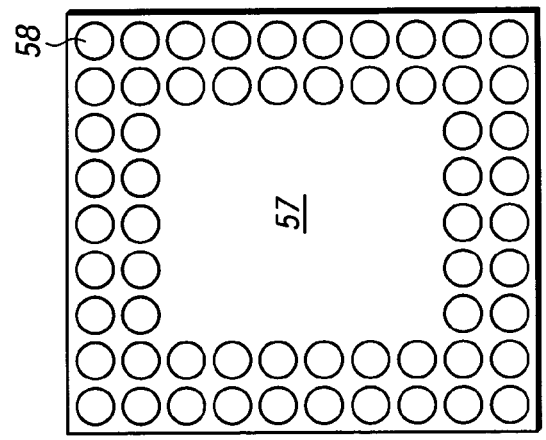
FIG. 9 illustrates a bottom view of a substrate with conductive bumps on four sides of the top semiconductor package of FIG. 3.
Figure 8:
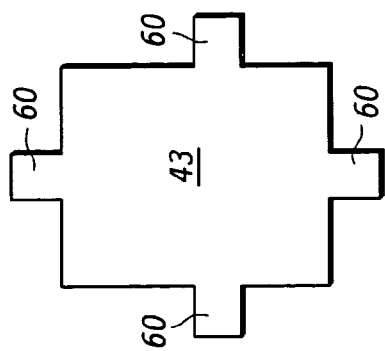
FIG. 8 illustrates a top view of another form of an element inserted between the semiconductor packages of FIG. 3.

Illustrated in FIG. 8 is a top view of yet another physical configuration of material 43 also taken along line 4—4 of FIG. 3. This configuration enables the use of material 43 in a situation where the bottom surface of package substrate 57 of semiconductor package 44 is populated with conductive balls on all four sides. Shown are four extensions 60 of a predetermined length. The lengths may be the same or some or all may differ one from another. Four extensions are illustrated in consideration of the second semiconductor package 44 which as illustrated in FIG. 9 has four sides of its bottom surface of package substrate 57 populated with conductive balls, such as a conductive ball 58.

Figure 10:
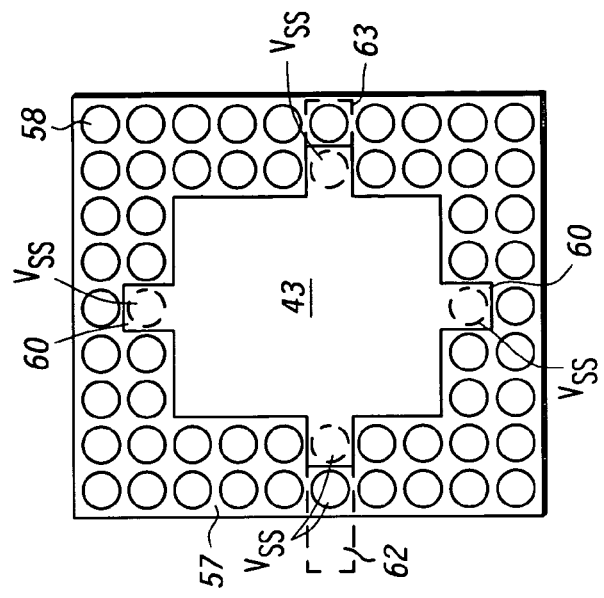
FIG. 10 illustrates in perspective form an overlay of the element of FIG. 8 with the bottom of the top semiconductor package as illustrated in FIG. 9.

Illustrated in FIG. 10 is an overlay of material 43 of FIG. 8 and the bottom surface of package substrate 57 of semiconductor package 44. In the illustrated form, the extensions are placed to extend from all four sides of the bottom surface of package substrate 57. In one configuration extension 60 may make contact with a conductive ball on the inner row only as illustrated on the left side of bottom surface of package substrate 57. In the illustrated form the conductive ball is at a ground or $V_{SS}$ voltage potential. However, other signal potentials may be implemented. In another configuration, the extension 62 may capture two laterally adjacent conductive balls and protrude a predetermined amount beyond the semiconductor package 44. The two laterally adjacent conductive balls are each connected to the same potential, such as a ground or $V_{SS}$ potential or other potentials. In another configuration, an extension 63 is only long enough to capture two laterally adjacent conductive balls before terminating. Again, the two laterally adjacent conductive balls are each connected to the same potential, such as a ground or $V_{SS}$ potential or other potentials. Variations to these structures may be readily made. For example, the number of lateral conductive balls on the sides of the semiconductor package 44 may differ and be expanded to greater than two rows or columns. It should be understood that the length L of the extension 62 may vary. It should also be understood that the extension 62 may remain lateral from the semiconductor package 44 or may be configured upward away from the motherboard 30 or downward toward, on or through the motherboard 30.

Figure 11:
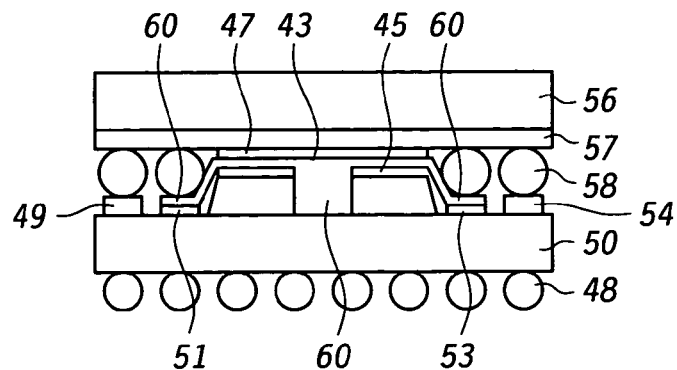
FIG. 11 illustrates in cross-sectional form the components of a packaged assembly of a stacked semiconductor package in accordance with another form of the present invention.

Illustrated in FIG. 11 is a completed assembly of the two semiconductor packages of FIG. 3 utilizing material 43 as illustrated in FIG. 8. For convenience of explanation, the reference numbers will therefore be the same in both of these figures. In the method of assembly, the first semiconductor package 42 is placed on the motherboard 30 in the desired predetermined position. The thin film material 45 is then placed on top of the mold cap 52 of the first semiconductor package 42. Typically the thin film material 45 is sufficiently tacky to remain in place while material 43 is placed on top of the thin film material 45. The thin film material 47 is then placed on top of the material 43. The bottom surface of the second semiconductor package 44 is then placed in contact with the thin film material 47. All placements are typically automated and performed with robotic equipment. In one form, after all components specified for a predetermined solder reflow cycle are placed or populated on the motherboard, the entire semiconductor stacked package assembly then passes through a reflow cycle in a reflow oven (not shown). During the reflow cycle, the two packages and material 43 will be secured in place by the thin film materials 45 and 47, along with the other components to the motherboard 30. Semiconductor packages 44 and 42 will attach one to another via the conductive balls. In the illustrated form, the thin film materials 45 and 47 serve to minimize the warpage induced by the thermal effects of the reflow cycle. The thin film materials 45 and 47 also serve to secure semiconductor package 42 and semiconductor package 44 to the material 43 and thereby prevent ease of separation. Additionally, material 43 provides for thermal and/or noise enhancement to the semiconductor package assembly. It should be noted that the thin film materials 45 and 47 are compliant and conformal to the exposed surfaces of both semiconductor packages and material 43. Materials 43, 45 and 47 may be the same material, may be composed of differing materials from each other or two of the materials 43, 45 and 47 may have the same composition. In some configurations the bottom surface of the top semiconductor package 44 may be bare silicon. The surface of the mold cap 52 of the bottom semiconductor package 42 may be any of numerous materials, including moldable plastics. Therefore the properties of the thin film materials 45 and 47 will cause the two semiconductor packages to adhere to material 43 and thereby improve the rigidity of the final stacked package assembly.

In the illustrated form of FIG. 11 the extensions 60 capture only one conductive ball of an interior row before terminating. Therefore, no extension of material 43 beyond the edges of semiconductor package 42 and semiconductor package 44 is depicted. It should be noted that solder land 51 and solder land 53 are each respectively thinner than solder land 49 and solder land 54 to accommodate the connection to material 43. The thinning of the solder land 49 and solder land 54 may, in one form, be accomplished by etching. In another form the thickness variation may be accomplished by conventional solder mask techniques.

Other modifications of the stacked package assembly of FIG. 11 may be made. For example, the extensions 60 may not be placed between any solder land and conductive bump. In such an implementation, the solder lands and conductive bumps that are immediately adjacent the mold cap of the lower semiconductor package are pushed further away to leave room for the extensions to connect directly to the upper surface of the substrate 50. In one form, the extensions 60 may be implemented as a continuous piece of material that completely surrounds the mold cap 52 in three hundred sixty degrees. The completely surrounding extension 60 therefore has a dome-like shape. In this form, noise shielding is afforded the semiconductor package completely around the mold cap and the extensions 60 remain inside of the edges of the stacked package assembly. In other forms the extensions 60 are implemented to form a rectangular or box structure. In yet other forms the extensions 60 are implemented to extend only along one side, along a portion of one side or along less than all sides of the mold cap 52. In these forms the extensions 60 are typically conformal in shape to the mold cap 52 but do not necessarily have to be conformal. In another form other numbers of lateral rows of conductive bumps adjacent the mold cap may be implemented than illustrated. In the illustrated form of FIG. 11, two rows of conductive bumps are provided. However, only one row, three rows or more may also be provided.

Figure 12:
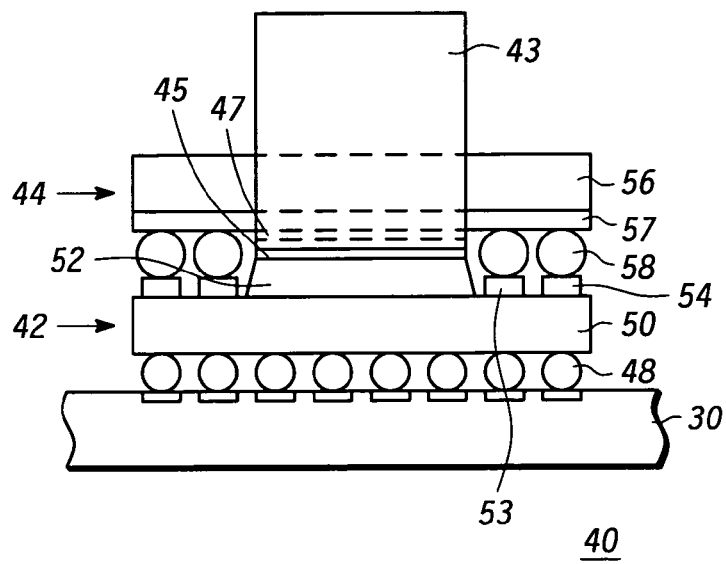
FIG. 12 illustrates in cross-sectional form the components of a packaged assembly of a stacked semiconductor package in accordance with a further form of the present invention.

Illustrated in FIG. 12 is another form of the stacked semiconductor package assembly 40 where material 43 laterally protrudes between the two semiconductor packages but is bent exterior to the stacked semiconductor package assembly 40 in an upward direction. Material 43 in this configuration may function to accomplish one or more objectives. In particular, the exposure to ambient air will function as a heat dispersion feature to enhance heat dissipation. Additionally, because material 43 is conductive, the placement of material 43 exterior to the stacked semiconductor package assembly 40 will permit the material 43 to electrically shield a predetermined portion of the stacked semiconductor package assembly 40. The external presence of material 43 as well as the upward bending of material 43 also allows flexibility to a user as to how ground or other voltage contact to material 43 may be accomplished. In another form, it should be understood that material 43 may not be bent and permitted to extend laterally from the stacked semiconductor package assembly 40 for thermal dissipation enhancement or for purposes of enabling electrical contact. Additionally, other angles of forming of material 43 besides the illustrated ninety degrees may be used.

Figure 13:
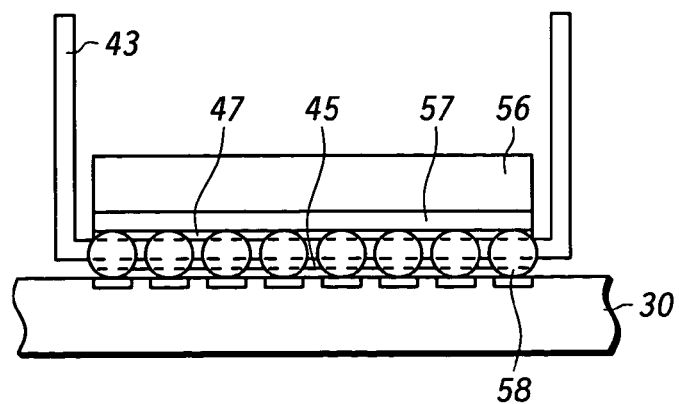
FIG. 13 illustrates a side view of the stacked semiconductor package arrangement of FIG. 12.

Illustrated in FIG. 13 is a side view of the stacked semiconductor package assembly 40 as depicted in FIG. 12. Illustrated is a single fin configuration using material 43. It should be understood that additional fins (not shown) may be added to further enhance the thermal dissipation properties of this method. Also, any angle of bending may be implemented depending upon the application even though FIG. 13 illustrates a substantially ninety degree bend.

Figure 14:
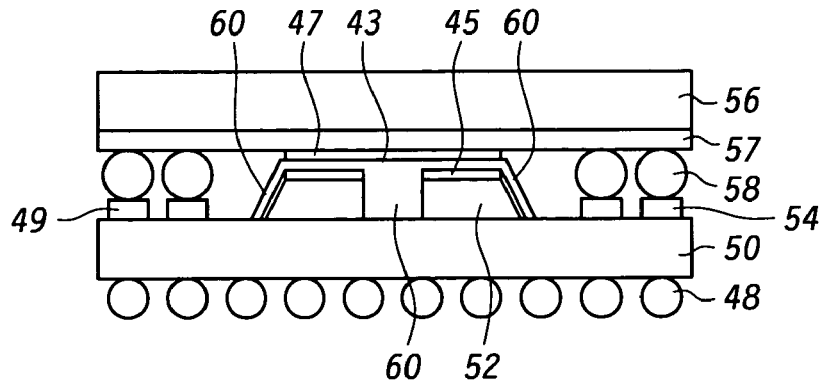
FIG. 14 illustrates in cross-sectional form the components of a packaged assembly of a stacked semiconductor package in accordance with a further form of the present invention.

Illustrated in FIG. 14 is one of the variations mentioned above in the discussion of FIG. 11 of the stacked package assembly. For convenience of discussion, elements in FIG. 14 that are analogous to the elements of FIG. 11 are numbered identically. In the illustrated form of FIG. 14, the extensions 60 do not extend between a conductive ball and a solder land as illustrated in FIG. 11. Rather, extensions 60 physically connect to the substrate 50 by making at least one of physical or electrical contact to the substrate 50. The solder lands and conductive balls are offset from the central region of the stacked package assembly to provide enough room for the extensions 60 to contact the substrate 50 without contacting a solder lands or conductive ball. In the illustrated form of FIG. 14, the extensions 60 effectively surround the mold cap and provide shielding.

Figure 15:
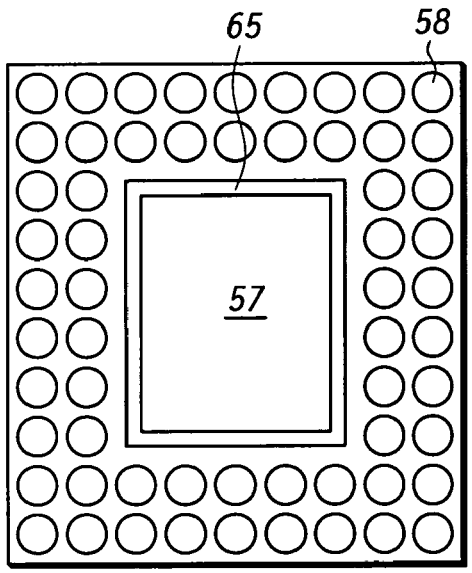
FIG. 15 illustrates a bottom view of the upper semiconductor package of FIG. 14.

Illustrated in FIG. 15 is a bottom view of the upper semiconductor package of the stacked package assembly of FIG. 14. A contact area 65 is illustrated surrounding the package substrate 57. In the illustrated form the contact area 65 is rectangular but other geometric forms may be used. The contact area 65 is a designated area overlying the areas on the substrate 50 in which the extensions 60 may make contact to the substrate 50. Additionally, rather than extensions 60 making contact to the lower semiconductor package, the extensions 60 may be angled upward to make contact to the upper semiconductor package within the area defined by the contact area 65. It should be understood that additional conductive balls or fewer conductive balls, such as conductive ball 58, may be implemented.

Figure 16:
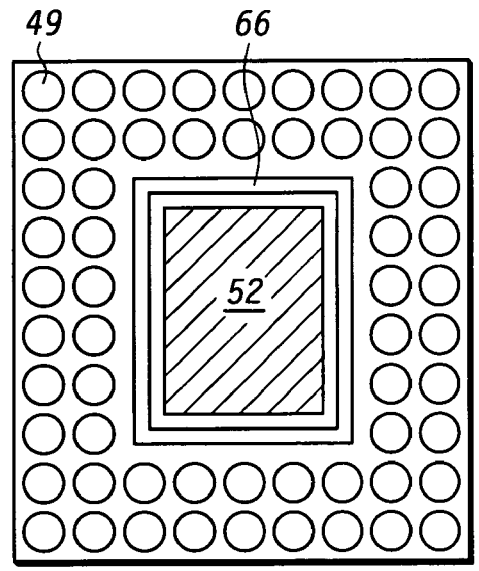
FIG. 16 illustrates a top view of the lower semiconductor package of FIG. 14.

Illustrated in FIG. 16 is a top view of the bottom or lower semiconductor package of the stacked package assembly of FIG. 14. A contact area 66 is illustrated surrounding the mold cap 52. The contact area 66 is a designated area on the substrate 50 in which the extensions 60 may make contact to the substrate 50. As in connection with FIG. 15, the total number of conductive balls may vary. The amount of the periphery around the mold cap 52 that the extensions 60 cover may vary from a percentage of one side to the entire periphery.

By now it should be appreciated that there has been provided a stacked semiconductor package and method of formation thereof. By stacking multiple integrated circuit packages as described herein, package rigidity is increased which provides manufacturing yield improvement. Increased data security from unauthorized retrieval, thermal enhancement and noise abatement are also provided.

In one form there has been provided a stacked semiconductor package assembly. A first semiconductor package has a first surface having a first plurality of conductive bumps attached thereto for making electrical connection to the first semiconductor package, and having an opposite and non-planar second surface comprising a mold cap and a plurality of adjoining solder lands. A second semiconductor package overlies the first semiconductor package having a first surface and an opposite second surface. The second surface has a second plurality of conductive bumps positioned outside of a central portion of the second surface and is in contact with the plurality of adjoining solder lands of the first semiconductor package. The second semiconductor package makes direct electrical contact to the first semiconductor package via the second plurality of conductive bumps. An intervening element is positioned in direct contact with and between the first semiconductor package and the second semiconductor package. The intervening element is sufficiently tacky to adhere to each of the first semiconductor package and the second semiconductor package and provides rigidity to adjoining surfaces of the first semiconductor package and the second semiconductor package in contact with the intervening element. The intervening element is surface conformal to the first semiconductor package and the second semiconductor package. An underlying substrate has a plurality of contacts. Each of the plurality of contacts of the underlying substrate is in contact with at least one of the first plurality of conductive bumps of the first semiconductor package.

In one form the intervening element is a thermally activated flexible material. The intervening element is flexible enough to form without fracturing. In another form the second semiconductor package is a data storage integrated circuit for storing secure data. In another form the intervening element extends laterally outside from a perimeter of the first semiconductor package and the second semiconductor package. In yet another form the intervening element extends laterally outside from a perimeter of the first semiconductor package and the second semiconductor package and is angled in a direction away from the underlying substrate. In yet another form the intervening element extends laterally outside from a perimeter of the first semiconductor package and the second semiconductor package and is angled toward the underlying substrate to make electrical contact thereto. In yet another form the intervening element is connected to at least one of an electrically conductive or an insulating terminal when electrical contact to the underlying substrate is made. The electrically conductive terminal may be a reference voltage terminal, a power supply terminal, a ground terminal, a signal terminal or other type of terminal. The insulating terminal may be a housing terminal, a casing terminal, a mounting stud, a connection to an insulating material such as an oxide or nitride or other type of electrically non-conductive terminal. In a further form the intervening element extends laterally outside from a perimeter of the first semiconductor package and the second semiconductor package and is angled toward and through the underlying substrate for making at least one of electrical or physical contact thereto from a back side of the underlying substrate. In yet another form the second plurality of conductive bumps of the second semiconductor package that are positioned outside of a central portion of the second surface are positioned along only two opposing sides of the second surface and the intervening element extends laterally from the stacked semiconductor package assembly from an adjacent two opposing sides of the second surface. In another form the intervening element extends from above the mold cap to physically contact the underlying substrate for noise isolation and thermal enhancement of the stacked semiconductor package assembly.

In a further form a stacked semiconductor package assembly has a first semiconductor package having a first surface having a first plurality of contacts for making electrical connection to the first semiconductor package. An opposite second surface has a second plurality of contacts. A second semiconductor package overlies the first semiconductor package and includes a first surface and an opposite second surface. The second surface has a third plurality of contacts positioned thereon and is respectively in contact with the second plurality of contacts of the first semiconductor package. The second semiconductor package makes direct electrical contact to the first semiconductor package. An intervening element is positioned in direct contact with and between a portion of the first semiconductor package and the second semiconductor package. The intervening element is sufficiently tacky to adhere to each of the first semiconductor package and the second semiconductor package and provides rigidity to adjoining surfaces of the first semiconductor package and the second semiconductor package in contact with the intervening element. The intervening element is surface conformal to the first semiconductor package and the second semiconductor package and has a portion extending laterally from a periphery of the stacked semiconductor package assembly. An underlying substrate has a fourth plurality of contacts. Each of the fourth plurality of contacts of the underlying substrate is in contact with at least one of the first plurality of contacts of the first semiconductor package.

In one form the intervening element is angled in a direction away from the underlying substrate. In another form the intervening element extends laterally outside from a perimeter of the first semiconductor package and the second semiconductor package and is angled toward the underlying substrate to make electrical contact thereto. In yet another form the intervening element is connected to a fixed voltage terminal when electrical contact to the underlying substrate is made.

In yet another form there is herein provided a stacked semiconductor package assembly having a first semiconductor package. A first surface thereof has a first plurality of conductive bumps attached thereto for making electrical connection to the first semiconductor package, and has an opposite and nonplanar second surface having a mold cap and a plurality of adjoining solder lands. A second semiconductor package overlies the first semiconductor package and includes a first surface and an opposite second surface. The second surface includes a second plurality of conductive bumps positioned outside of a central portion of the second surface and is in electrical contact with the plurality of adjoining solder lands of the first semiconductor package. The second semiconductor package makes electrical contact to the first semiconductor package via the second plurality of conductive bumps. A conductive adhesive layer is positioned in a central region of the stacked semiconductor package assembly and is in direct contact with and between the first semiconductor package and the second semiconductor package. A portion of the conductive adhesive layer extends from the central region and is between and in electrical contact with at least one of the first plurality of contacts and the one of the second plurality of contacts. An underlying substrate has a plurality of contacts, each of the plurality of contacts of the underlying substrate is in contact with at least one of the first plurality of conductive bumps of the first semiconductor package.

In one form the at least one of the first plurality of contacts and the one of the second plurality of contacts are connected to a fixed voltage terminal to further enhance at least one of electrical shielding or heat dissipation between the first semiconductor package and the second semiconductor package. In yet another form the conductive adhesive layer is a film of thermally activated flexible material. In a further form the second semiconductor package is a data storage integrated circuit for storing secure data. In yet a further form the portion of the conductive adhesive layer that extends from the central region extends laterally between multiple ones of the first plurality of contacts and the second plurality of contacts toward at least two sides of the stacked semiconductor package assembly. In yet another form a second portion of the conductive adhesive layer extends laterally beyond an outer edge of the stacked semiconductor package assembly.

In the foregoing specification, the invention has been described with reference to specific embodiments. However, one of ordinary skill in the art appreciates that various modifications and changes can be made without departing from the scope of the present invention as set forth in the claims below. For example, while the embodiments described illustrated a thin film material for materials 16, 45 and 47, it should be well understood that materials of varying thickness may be used so that the thickness would not necessarily be considered or classified in the industry as being "thin film" in nature. Various conductive materials may be used to implement each and all of the elements described herein as being electrically or thermally conductive. Various semiconductor encapsulating materials may be used for the semiconductor packages that are stacked. For example, plastic molding compounds, ceramics and other semiconductor materials may be used. Any number of semiconductor devices may be stacked. The stacked semiconductor package assembly described herein may also be used in connection with leaded semiconductor packages, direct chip attach (DCA) flip chip devices, land grid arrays (LGAs) and leadless chip carriers (LCCs) in addition to ball grid array packages. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more. The terms "including" and/or "having", as used herein, are defined as "comprising" (i.e., open language). The term "coupled", as used herein, is defined as connected, although not necessarily directly, and not necessarily mechanically.

What is claimed is:

1. A stacked semiconductor package assembly comprising:

a first semiconductor package comprising a first surface having a first plurality of conductive bumps attached thereto for making electrical connection to the first semiconductor package, and comprising an opposite and nonplanar second surface comprising a mold cap and a plurality of adjoining electrical contacts;

a second semiconductor package overlying the first semiconductor package comprising a first surface and an opposite second surface, the second surface comprising a second plurality of conductive bumps positioned outside of a central portion of the second surface and in contact with the plurality of adjoining electrical contacts of the first semiconductor package, the second semiconductor package making direct electrical contact to the first semiconductor package via the second plurality of conductive bumps;

an intervening element positioned in direct contact with and between the first semiconductor package and the second semiconductor package, the intervening element being sufficiently tacky to adhere to each of the first semiconductor package and the second semiconductor package and provide rigidity to adjoining surfaces of the first semiconductor package and the second semiconductor package in contact with the intervening element, the intervening element being surface conformal to the first semiconductor package and the second semiconductor package, the intervening element extending laterally outside a perimeter of at least one of the first semiconductor package and the second semiconductor package and bending a predetermined amount; and an underlying substrate having a plurality of contacts, each of the plurality of contacts of the underlying substrate being in contact with at least one of the first plurality of conductive bumps of the first semiconductor package.

2. The stacked semiconductor package assembly of claim 1 wherein the intervening element is a thermally activated material.

3. The stacked semiconductor package assembly of claim 1 wherein the second semiconductor package is a data storage integrated circuit for storing secure data.

4. The stacked semiconductor package assembly of claim 1 wherein the intervening element extends laterally outside from a perimeter of the first semiconductor package and the second semiconductor package.

5. The stacked semiconductor package assembly of claim 4 wherein the intervening element extends laterally outside from a perimeter of the first semiconductor package and the second semiconductor package and is angled in a direction away from the underlying substrate.

6. The stacked semiconductor package assembly of claim 4 wherein the intervening element extends laterally outside from a perimeter of the first semiconductor package and the second semiconductor package and is angled toward the underlying substrate to make electrical contact thereto.

7. The stacked semiconductor package assembly of claim 6 wherein the intervening element is connected to at least one of an electrically conductive or an insulating terminal when electrical contact to the underlying substrate is made.

8. The stacked semiconductor package assembly of claim 4 wherein the intervening element extends laterally outside from a perimeter of the first semiconductor package and the second semiconductor package and is angled toward and through the underlying substrate for making at least one of electrical or physical contact thereto from a back side of the underlying substrate.

9. The stacked semiconductor package assembly of claim 1 wherein the second plurality of conductive bumps of the second semiconductor package that are positioned outside of a central portion of the second surface are positioned along only two opposing sides of the second surface and the intervening element extends laterally from the stacked semiconductor package assembly from an adjacent two opposing sides of the second surface.

10. The stacked semiconductor package assembly of claim 1 wherein the intervening element extends from above the mold cap to physically contact the underlying substrate for noise isolation and thermal enhancement of the stacked semiconductor package assembly.

11. A stacked semiconductor package assembly comprising:

a first semiconductor package comprising a first surface having a first plurality of contacts for making electrical connection to the first semiconductor package, and comprising an opposite second surface comprising a second plurality of contacts;

a second semiconductor package overlying the first semiconductor package comprising a first surface and an opposite second surface, the second surface comprising a third plurality of contacts positioned thereon and respectively in contact with the second plurality of contacts of the first semiconductor package, the second semiconductor package making direct electrical contact to the first semiconductor package;

an intervening element positioned in direct contact with and between a portion of the first semiconductor package and the second semiconductor package, the intervening element being sufficiently tacky to adhere to each of the first semiconductor package and the second semiconductor package and provide rigidity to adjoining surfaces of the first semiconductor package and the second semiconductor package in contact with the intervening element, the intervening element being surface conformal to the first semiconductor package and the second semiconductor package and comprising a portion that extends laterally from a periphery of the stacked semiconductor package assembly and bends at a predetermined angle; and an underlying substrate having a fourth plurality of contacts, at least one of the fourth plurality of contacts of the underlying substrate being in contact with at least one of the first plurality of contacts of the first semiconductor package.

12. The stacked semiconductor package assembly of claim 11 wherein the intervening element is angled in a direction away from the underlying substrate.

13. The stacked semiconductor package assembly of claim 11 wherein the intervening element extends laterally outside from a perimeter of the first semiconductor package and the second semiconductor package and is angled toward the underlying substrate to make electrical contact thereto.

14. The stacked semiconductor package assembly of claim 13 wherein the intervening element is connected to at least one of an electrically conductive or an insulating terminal when electrical contact to the underlying substrate is made.

15. A stacked semiconductor package assembly comprising:

a first semiconductor package comprising a first surface having a first plurality of conductive bumps attached thereto for making electrical connection to the first semiconductor package, and comprising an opposite and nonplanar second surface comprising a mold cap and an adjoining plurality of electrical contacts;

a second semiconductor package overlying the first semiconductor package comprising a first surface and an opposite second surface, the second surface comprising a second plurality of conductive bumps positioned outside of a central portion of the second surface and in electrical contact with the plurality of adjoining electrical contacts of the first semiconductor package, the second semiconductor package making electrical contact to the first semiconductor package via the second plurality of conductive bumps;

a thermally conductive adhesive layer positioned in at least a central region of the stacked semiconductor package assembly and in direct contact with and between the first semiconductor package and the second semiconductor package and overlying the mold cap of the first semiconductor package, a portion of the thermally conductive adhesive layer extending from the central region and bending downward to physically separate at least one of the plurality of electrical contacts and one of the second plurality of conductive bumps; and an underlying substrate having a plurality of contacts, each of the plurality of contacts of the underlying substrate being in contact with at least one of the first plurality of conductive bumps of the first semiconductor package.

16. The stacked semiconductor package assembly of claim 15 wherein the at least one of the plurality of electrical contacts and the one of the second plurality of conductive bumps are connected to at least one of an electrically conductive or an insulating terminal to further enhance at least one of electrical shielding or heat dissipation between the first semiconductor package and the second semiconductor package.

17. The stacked semiconductor package assembly of claim 15 wherein the thermally conductive adhesive layer comprises a film of thermally activated flexible material.

18. The stacked semiconductor package assembly of claim 15 wherein the second semiconductor package is a data storage integrated circuit for storing secure data.

19. The stacked semiconductor package assembly of claim 15 wherein the portion of the thermally conductive adhesive layer that extends from the central region extends laterally between multiple ones of the plurality of electrical contacts and the second plurality of conductive bumps toward at least two sides of the stacked semiconductor package assembly.

20. The stacked semiconductor package assembly of claim 15 wherein a second portion of the thermally conductive adhesive layer extends laterally beyond an outer edge of the stacked semiconductor package assembly.

* * * * *